Feb. 13, 1968 F. F. FANG ET AL 3,369,132

OPTO-ELECTRONIC SEMICONDUCTOR DEVICES

Filed Nov. 14. 1962 3 Sheets-Sheet 1

INVENTORS
FRANK F. FANG
TSU-HSING YEH
HWA N. YU

BY John F. Ohlandt Jr.
ATTORNEY

COMMON EMITTER $I_C$-$V_C$ CURVES

COMMON BASE $I_C$-$V_C$ CURVES

United States Patent Office 3,369,132

Patented Feb. 13, 1968

3,369,132

OPTO-ELECTRONIC SEMICONDUCTOR DEVICES

Frank F. Fang, Yorktown Heights, Tsu-Hsing Yeh, Poughkeepsie, and Hwa Nien Yu, Yorktown Heights, N.Y., assignors to International Business Machines Corporation, New York, N.Y., a corporation of New York Filed Nov. 14, 1962, Ser. No. 237,501
8 Claims. (Cl. 307—299)

This invention relates to semiconductor devices and in particular to such devices wherein the phenomenon of recombination radiation is effectively utilized.

It has previously been discovered that in certain semiconductor materials which are appropriately doped, and with proper bias applied to a p-n junction so as to cause injection of carriers, highly efficient light emission may be obtained due to recombination radiation. For a discussion of the subject, reference may be made to an article by R. W. Keyes and T. M. Quist in the Proceedings of the IRE, vol. 50, page 1882 (1962).

Recombination radiation, as that term is understood in the semiconductor art, refers to a phenomenon where charge carriers, that is, holes and electrons, recombine and produce photons. The recombination process, per se, involves annihilating encounters between the two types of charge carriers within a semiconductor body whereby the carriers effectively disappear. Certain kinds of recombinations have been known to produce radiation but, until recently, radiation has been inefficiently produced.

Transistors have found wide application during the past decade or so as signal translating devices, such as in amplifiers, oscillators and modulators, etc. Most prominently utilized today is the kind of transistor known as a junction transistor. In the junction transistor two or more junctions are defined by contiguous zones or regions within a semiconductor body, which regions vary in their conductivity type. Usually this variation involves a successive alternation between what is known as p conductivity type material, wherein the majority carriers are holes, and n conductivity type material wherein the majority carriers are electrons. In general, semiconductor junction devices have involved injection of carriers into a zone or zones within the semiconductor body. These injected carriers are of a sign opposite those normally present in excess within the region. Thus, in the simple case of a p-n-p junction transistor, minority carriers, i.e., holes, are injected into a base region which is of n conductivity type and wherein the majority carriers are electrons.

Injection of carriers, as discussed above, is on operating feature of the conventional junction transistor according to which minority carrier injection is controlled in accordance with signals to be translated. The injected minority carriers, for example, the holes or positive charge carriers referred to above in the case of p-n-p transistors, or the electrons in an n-p-n transistor, diffuse through the base region to a junction where they are collected, thereby increasing the output current. With substantially different impedances for the respective input and output junctions in a conventional junction transistor, power amplification is obtainable in an output or load circuit associated with the collecting junction. Also voltage or current amplification can be obtained.

The movement of the charge carriers through the base region ordinarily occurs solely by the mechanism of diffusion, except for the acceleration of carriers due to the creation of a drift field in certain specialized types of transistor devices. Since the thickness of the base region determines the transit time of injected minority carriers through the base region for a given diffusion constant, a severe requirement is imposed on base layer thickness if it is desired to operate at extremely high frequencies. The present invention allows for the relaxation of the requirement imposed on base layer thickness and still permits high speed operation. High speed operation is possible due to the fact that the emitted light resulting from the injection of carriers will propagate at a much higher velocity than is obtainable with diffusion or drift field mechanisms.

It should be noted that in the design of a conventional transistor, an important criterion is a low recombination rate corresponding to a relatively long life time for minority carriers. In contradistinction to this criterion for an ordinary transistor, it is highly desirable in the device of the present invention to have a high recombination rate corresponding to a short life time for minority carriers. Such a short life time ensures a great amount of emission at the junction when carriers are injected.

A broad feature of the present invevntion resides in the provision of an opto-electronic device using light as the transporting medium across the base region of the device and in the further provision of a suitable hetero-junction for the absorption of light and consequent collection of charge carriers. By the term hetero-junction is meant a junction between two different semiconductor materials such as GaAs and Ge, with continuous lattice structure.

As envisioned by the present invention, a hetero-junction is located at the collecting end of the device where effectively an optical signal is absorbed and converted back into an electrical signal. Power gain is realizable with such a device when the optical emission efficiency is high, the optical propagation has low loss and the absorption efficiency is high. The reason behind the use of a hetero-junction at the collecting end of the device is that for efficient absorption one wants a material for the collector which has a band gap narrower than the band gap of the base material. Otherwise one would expect that most of the emitted light would penetrate through, instead of being absorbed by, the material at the collector.

The foregoing and other objects, features and advantages of the invention will be apparent from the following more particular description of preferred embodiments of the invention, as illustrated in the accompanying drawings.

Although reference will be made hereinafter to the specific use of GaAs as a suitable semiconductor material wherein the phenomenon of recombination radiation may be exploited, it should be borne in mind that the concept of the present invention is not limited to this one material and that other suitable wide band gap materials can be similarly utilized.

Figure 1:
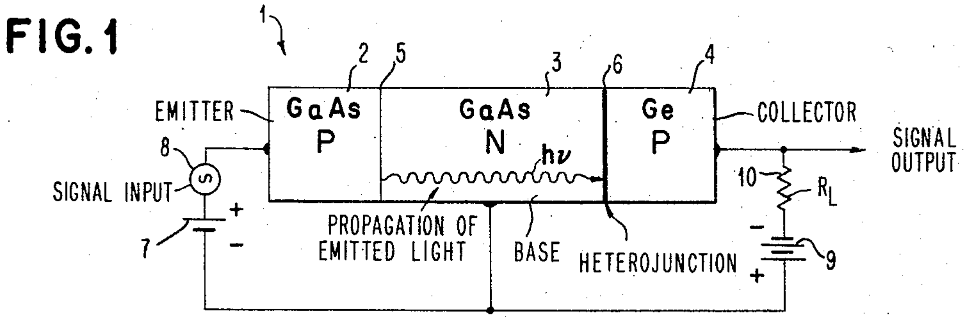
FIGURE 1 is a schematic diagram of a p-n-p opto-electronic semiconductor device according to the present invention, connected in a circuit.

Referring now to FIGURE 1, a p-n-p opto-electronic device is shown connected in a circuit to provide amplification. The device per se is labeled 1 and the monocrystalline semiconductor body of the device is constituted principally of GaAs. The emitter region 2 of the device is of p conductivity type, the base region 3 is of n conductivity type and the collector region 4 is, again, of p conductivity type. A first junction 5 is defined by the emitter and base regions 2 and 3 and a second junction 6 is defined by base and collector regions 3 and 4. The collector region 4, unlike the emitter and base regions 2 and 3, is constituted of Ge which is grown epitaxially upon the base region 3. That is, to say, the base and collector regions are single crystal throughout due to the fact that the collector region is formed so as to follow the crystalline orientation and periodicity of the main part of the semiconductor structure. A fixed source of voltage, shown as a battery 7, has its negative side connected to the base region of the device 1 and a superimposed alternating source 8 is shown connected to the positive side of the battery 7 and to a contact on the emitter region 2. The fixed voltage source 7 therefore is connected so as to provide forward bias of junction 5. Another fixed voltage source labeled 9 has its positive side connected to the base region 3 and resistor 10 has one end connected to the negative side of the fixed voltage source 9 and the other end of the resistor is connected to a contact on the collector 4. Voltage source 9 thus provides reverse bias on junction 6. The signal output is taken across the resistor 10.

In operation of the device configuration illustrated in FIGURE 1 the GaAs base-emitter junction 5 is forward biased so as to actuate radiation recombination due to the injection of charge carriers. The light which is emitted due to recombination propagates, as is indicated by the arrow labeled $h\nu$, without appreciable loss of the total light flux. When the light strikes the hetero-junction 6 the light previously emitted is absorbed. Thus the optical radiation is converted back to an electrical signal through proper biasing. As previously indicated, the biasing scheme is such that the Ge-GaAs hetero-junction 6 is reverse biased.

Figure 5:
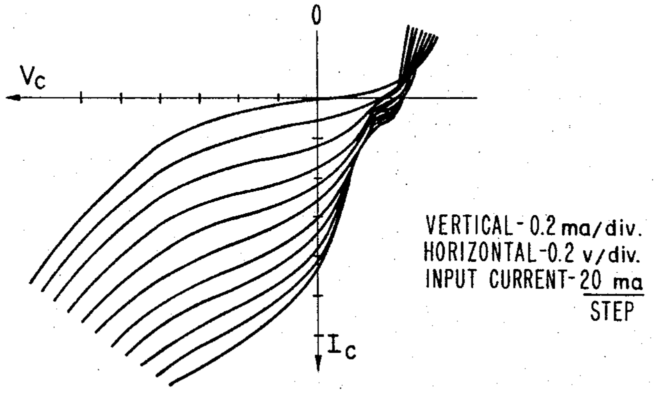
FIGURE 5 depicts a family of IV output characteristic curves with base current as the parameter (common emitter).
Figure 4:
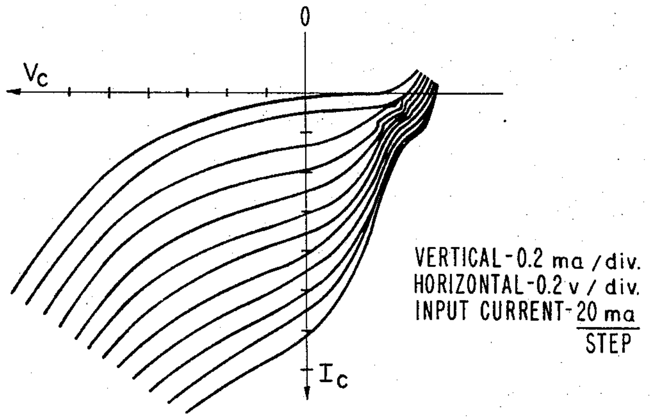
FIGURE 4 depicts a family of IV output characteristic curves with emitter current as the parameter (common base).

FIGURE 4 depicts the $I_c$–$V_c$ characteristic curves for the device of FIGURE 1 in the common base connection, as illustrated in FIGURE 1. The device of FIGURE 1 has a transfer factor ($\alpha$) of approximately .007 from emitter to collector. The output resistance in the proper operating region for the device of FIGURE 1 is about 5,000 ohms. The differential resistance, $[dV_e/dI_e]\ V_c$, in the emitter is about 1 ohm, with an emitter current variation of from 20 milliamps to 100 milliamps. The $I_c$–$V_c$ characteristic curves in FIGURE 5 are for the device of FIGURE 1 but in the common emitter connection, well known to those skilled in the art.

The device shown in FIGURE 1 is constructed by the following method. A suitable doped GaAs n-type wafer is used as the starting material. A suitable dopant for obtaining n conductivity type is Te. By means of a conventional diffusion process wherein a typical impurity such as Zn or Cd is employed, a layer on the surface of the n-type GaAs wafer or substrate is converted to p conductivity type so as to create the GaAs p-n junction 5 as shown in FIGURE 1. On the opposite surfaces of the n-type substrate of GaAs a layer of p-type Ge is grown epitaxially to form the n-p GaAs-Ge hetero-junction 6. Typically this layer of p-type Ge is grown from the vapor phase by a technique such as that disclosed in the IBM Journal of Research and Development, July 1960, by R. L. Anderson on page 283, "Germanium-Gallium Arsenide Heterojunctions." With proper ohmic contacts made to the structure, for example by soldering, the device of FIGURE 1 is connected in circuit and operated as previously described.

Although the device of FIGURE 1 is shown in a p-n-p configuration, it will be apparent to those skilled in the art that the opposite polarity configuration can also be realized, that is, an n-p-n device.

Figure 2:
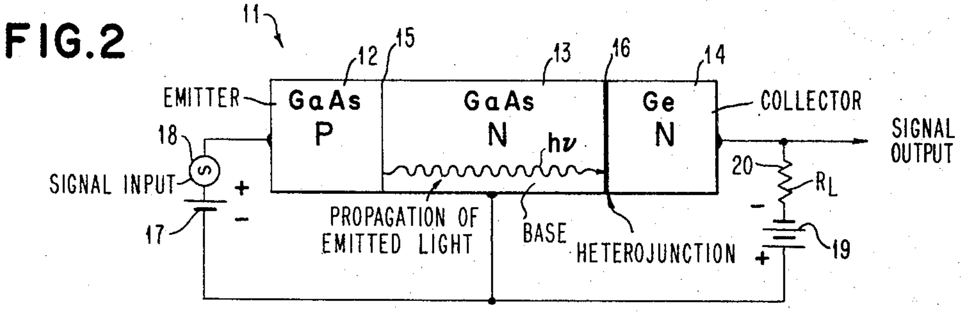
FIGURE 2 is a schematic diagram of a p-n-n opto-electronic device according to the present invention.
Figure 3:
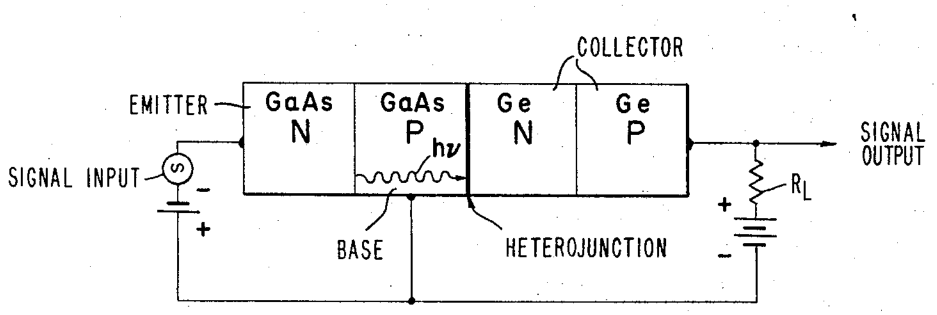
FIGURE 3 shows a modified version of an opto-electronic semiconductor device having a four layer structure.

Referring now to FIGURES 2 and 3, several variations and modifications of the device of FIGURE 1 are illustrated. The device 11 of FIGURE 2 is one formed in a p-n-n configuration. The emitter 12 is constituted of p-type GaAs and the base 13 of n-type GaAs. The same input bias as was used with the device 1 of FIGURE 1 is also employed for the device 11 of FIGURE 2. Thus, forward bias is shown applied to the input junction 15. The collecting hetero-junction 16 of device 11 is defined by an n-type region 13 of GaAs and an n-type region 14 of Ge. Again, the polarity of the voltage source 19 is applied in the output circuit in the same manner as in the output circuit of FIGURE 1. Incidentally it should be noted that, although the output junction of FIGURE 2 is defined by two regions of the same conductivity type, this output junction has asymmetric characteristics since it is a junction defined by different semiconductor materials. A discussion of such asymmetric characteristics is also contained in the aforesaid article of R. L. Anderson.

The device of FIGURE 3 has a four layer structure but is basically similar to the device of FIGURE 1, except for being of opposite polarity configuration. However, the structure in FIGURE 1 consists of only three zones or regions shown therein whereas in FIGURE 3 a layer has been added to the Ge collector region so that the collector effectively is a hook collector made up of two distinct regions of opposite conductivity type. With such a hook collector at its output, the device of FIGURE 3 takes advantage of current multiplication and thus current gain will be realizable in this device. The emission and absorption of radiation, however, proceeds as previously described.

Figure 7:
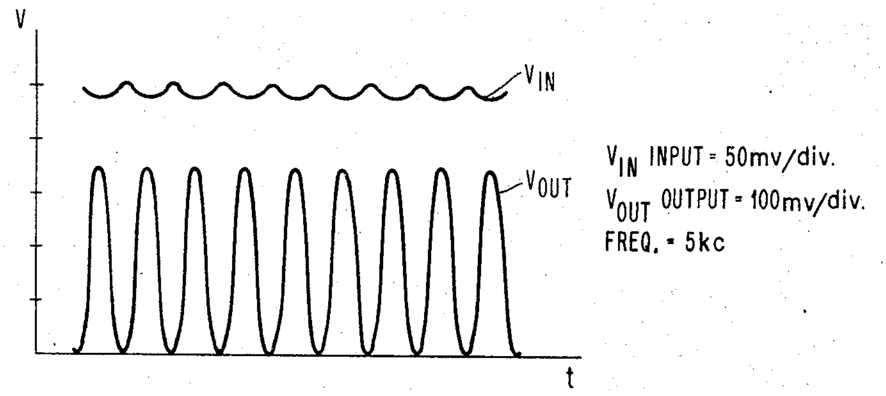
FIGURE 7 depicts the input and the output wave forms for the amplifier circuit of FIGURE 6.
Figure 6:
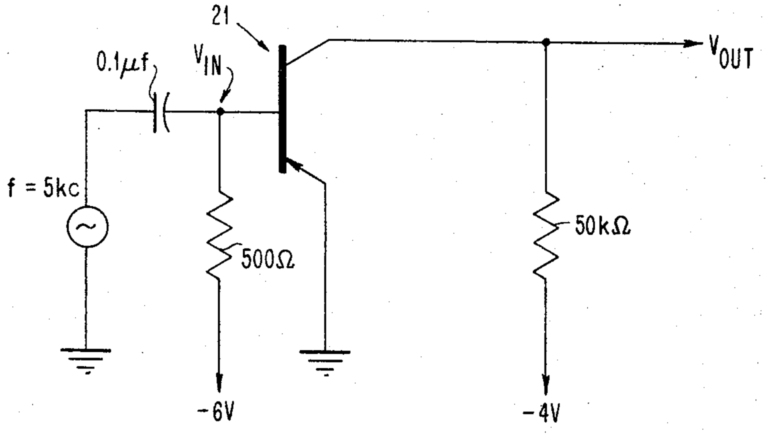
FIGURE 6 is a circuit diagram illustrating a connection of a p-n-p opto-electronic device for operation as a voltage amplifier.

Referring now to FIGURE 6 there is illustrated a voltage amplifier application for the device of the present invention. The device 21 is shown in a common emitter connection circuit. This voltage amplifier is constructed with the values as indicated for the various components. A voltage amplification on the order of 27 is obtained at a frequency of 5 kc. The input and the output wave forms for this voltage amplifier circuit are shown in FIGURE 7.

What has been disclosed is a basic opto-electronic device and a number of modifications thereof. All of these devices are useful in the electronics field as amplifiers, modulators, oscillators, etc. These devices permit the attainment of extremely high frequency operation and, concomitantly, allow for obtaining power amplification.

As previously indicated, it will be apparent to those versed in the art that other semiconductor materials and particularly, combinations of semiconductor materials, can be used in the fabrication of the devices in accordance with the present invention. For example, the main part or body of the semiconductor device may be constituted of GaP and within this main part or body the emitting p-n junction is created. A hetero-junction is then provided, defined by the original base region of GaP and an added collector region of Si, which is utilized for absorption of light and collection of charge carriers.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An opto-electronic device including two spaced junctions in a body of monocrystalline semiconductor material which are coupled by electromagnetic recombination radiation rather than by minority carrier diffusion, said device comprising:

(a) a single body of monocrystalline semiconductor material having first and second spaced junctions;
(b) means forward biasing said first junction;
(c) means reverse biasing said second junction;
(d) doping means in said body at said first junction providing an excess of charge carriers of one conductivity type on one side of said first junction and an excess of charge carriers of opposite conductivity type on the opposite side of said first junction;

(e) said charge carriers of one conductivity type responding to said forward bias by being injected in a direction across said first junction toward the other side of said first junction;

(f) said doping means on the other side of said first junction providing sufficient charge carriers of opposite conductivity type that said injected carriers have a short lifetime and the majority of said injected carriers recombine with the charge carriers of opposite conductivity type to produce electromagnetic recombination radiation rather than diffusing to said second junction;

(g) at least a portion of the semiconductor material in the vicinity of said second junction which is reverse biased having a narrower band gap than the band gap of the connecting portion of the semiconductor body extending between said first and second junctions;

(h) and said connecting portion of said body conducting said recombination radiation from said first junction to said narrower band gap material at said second reverse biased junction which absorbs said radiation and produces charge carriers which are collected at said second junction;

(i) whereby said first and second junctions are coupled primarily by said electromagnetic recombination radiation.

2. The opto-electronic device of claim 1 wherein said body includes first, second and third contiguous regions with said first junction being between said first and second regions, said second junction being between said second and third regions, and said second region extending between said junctions;

and said first and second regions are one semiconductor material, said third region is a different semiconductor material having a lower band gap than said one semiconductor material, and said second junction is a hetero-junction.

3. The opto-electronic device of claim 2 wherein said one semiconductor material is gallium arsenide and said other semiconductor material is germanium.

4. The opto-electronic device of claim 2 wherein said second and third regions are of opposite conductivity type.

5. The opto-electronic device of claim 2 wherein said second and third regions are of the same conductivity type.

6. The opto-electronic device of claim 2 wherein said device includes a fourth region adjacent to said third region, said third and fourth regions are of opposite conductivity type, and said device includes a third junction between said third and fourth regions.

7. An opto-electronic device including two spaced junctions in a body of monocrystalline semiconductor material which are coupled by electromagnetic recombination radiation rather than by minority carrier diffusion, said device comprising:

(a) a single body of monocrystalline semiconductor material having first and second spaced junctions;

(b) doping means at said first junction providing charge carriers which are injected as minority carriers when a forward bias is applied at said first junction and which once injected have a high recombination rate corresponding to a short lifetime in said material;

(c) means forward biasing said first junction to inject at said first junction charge carriers a majority of which recombine radiatively to produce recombination radiation;

(d) means reverse biasing said second junction;

(e) at least a portion of the semiconductor material at said second junction which is reverse biased having a narrower band gap than the band gap of the connecting portion of the semiconductor body extending between said first and second junctions;

(f) and said connecting portion of said body conducting said recombination radiation from said first junction to said narrower band gap material at said second reverse biased junction which absorbs said radiation and produces charge carriers which are collected at said second junction;

(g) whereby said first and second junctions are coupled primarily by said electromagnetic recombination radiation.

8. An opto-electronic device including two spaced junctions in a body of monocrystalline semiconductor material which are coupled by electromagnetic recombination radiation rather than by minority carrier diffusion, said device comprising:

(a) a single body of monocrystalline semiconductor material having first and second spaced junctions;

(b) doping means at said first junction providing charge carriers which are injected as minority carriers when a forward bias is applied at said first junction and which once injected have a high recombination rate corresponding to a short lifetime in said material;

(c) means forward biasing said first junction to inject at said first junction charge carriers a majority of which recombine radiatively to produce recombination radiation;

(d) means reverse biasing said second junction;

(e) said second junction being a hetero-junction between first and second different semiconductor materials;

(f) said second semiconductor material being on the side of said second junction farthest from said first junction and having a narrower band gap than said first semiconductor material;

(g) the portion of the semiconductor body connecting said first and second junctions being said first semiconductor material and having said higher band gap for conducting said recombination radiation to said second junction;

(h) and said narrow band gap second semiconductor material at said reverse biased second junction absorbing said recombination radiation and producing charge carriers which are collected at said second junction;

(i) whereby said first and second junctions are coupled primarily by said electromagnetic radiation.

References Cited

UNITED STATES PATENTS

| | | | |
|---|---|---|---|
| 2,776,367 | 1/1957 | Lehovec | 317—235 |
| 3,043,958 | 7/1962 | Diemer | 317—235 |
| 3,043,959 | 7/1962 | Diemer | 317—235 |
| 3,082,283 | 3/1963 | Anderson | 317—235 |
| 3,200,259 | 8/1965 | Braunstein | 317—235 |

OTHER REFERENCES

Article by Anderson, "Ge-GaAs Heterojunctions," pp. 283–287 of IBM Journal of Research and Development, vol. 4, 1960.

Article by A. Coblenz at pp. R–4 and R–5 of June 1958 (midmonth) issue of Electronics Buyer's Guide.

Article by A. T. Fischer in Solid-State Electronics, Pergammon Press, 1961, pp. 232–246.

Article by Keyes et al., "Recombination Radiation Emitted by GaAs" at pp. 1822, 1823 of August 1962 edition (vol. 50) of IRE Proceedings.

JAMES D. KALLAM, *Primary Examiner.*

JOHN W. HUCKERT, *Examiner.*

A. M. LESNIAK, *Assistant Examiner.*